(12) United States Patent
Kawamura

(10) Patent No.: US 6,424,532 B2
(45) Date of Patent: *Jul. 23, 2002

(54) HEAT SINK AND MEMORY MODULE WITH HEAT SINK

(75) Inventor: Masashi Kawamura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,325

(22) Filed: Jun. 14, 1999

(30) Foreign Application Priority Data

Jun. 12, 1998 (JP) .......................... 10-164720

(51) Int. Cl.[7] ................................ H05K 7/20
(52) U.S. Cl. ...................... 361/708; 165/80.3; 165/185; 174/16.3; 257/722; 361/715; 361/710
(58) Field of Search .............................. 165/80.2, 80.3, 165/185; 174/16.3; 257/706–707, 712–713, 719–720, 722, 726, 727; 361/704, 707–710, 715, 719–720, 807, 809

(56) References Cited

U.S. PATENT DOCUMENTS 5,587,608 A * 12/1996 Meng .......................... 257/712
5,815,371 A * 9/1998 Jeffries et al. ............... 361/704
5,959,839 A * 9/1999 Gates .......................... 361/704
5,978,224 A * 11/1999 Barrow ........................ 361/704

FOREIGN PATENT DOCUMENTS

DE    44 10 467 A1    3/1994
DE    G 94 15 755.3    9/1994
JP    7-202120    8/1995

* cited by examiner

Primary Examiner—Gregory Thompson
(74) Attorney, Agent, or Firm—Hutchins, Wheeler & Dittma

(57) ABSTRACT

A memory module 10 is fitted with a "cover and heat sink" 5 having a U-shape in cross section in such a manner that the memory module 10 is inserted into a U-shaped deep recess of the "cover and heat sink" 5, and all packaged memory ICs 3 and the other components 2 mounted on each face of a printed circuit board 1 are covered by the "cover and heat sink" 5, with a silicone grease 6 being filled between the "cover and heat sink" 5 and the packaged memory ICs 3. The heat generated in each packaged memory IC 3 is conducted to the "cover and heat sink" 5 through the silicone grease 6, and the heat is radiated from the surface of the "cover and heat sink" 5 having a large surface area. In addition, since all the components 2 and 3 mounted on the printed circuit board 1 are covered with the "cover and heat sink" 5, the components 2 and 3 mounted on the printed circuit board 1 are protected from a mechanical shock. Furthermore, it is possible to discriminate whether or not the degree of the warping of the printed circuit board 1 exceeds a permissible limit. Because, if the warping of the printed circuit board exceeds a certain limit, the memory module cannot be inserted into the U-shaped deep recess of the "cover and heat sink" 5.

26 Claims, 3 Drawing Sheets

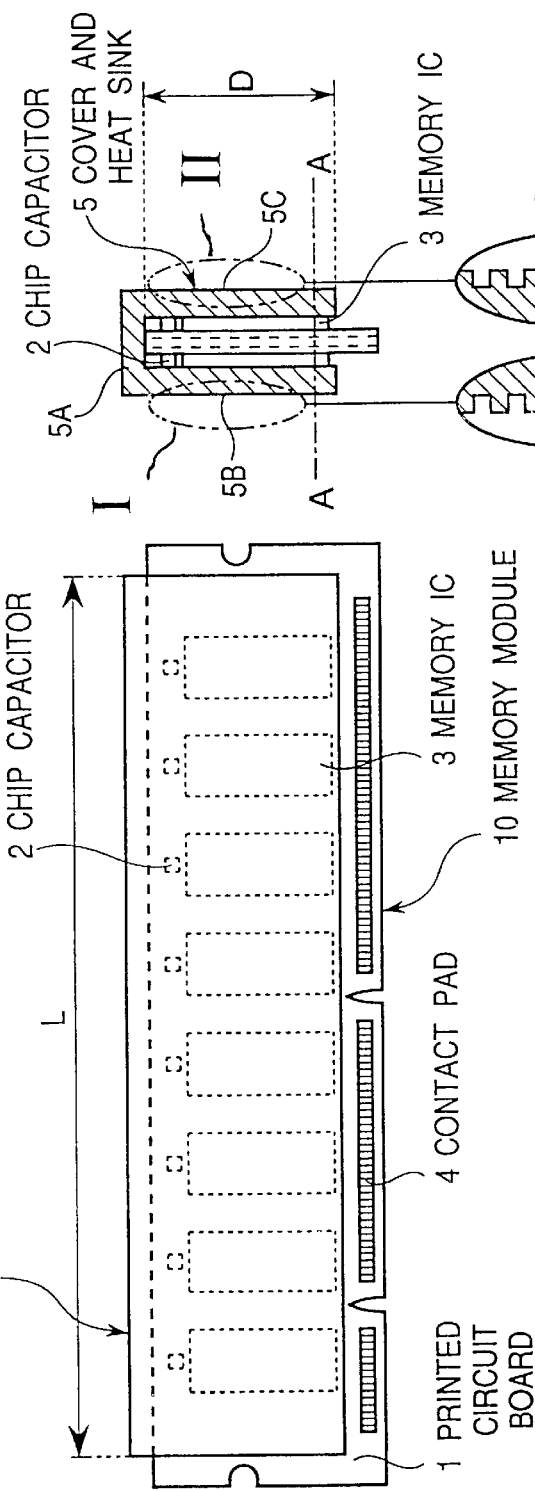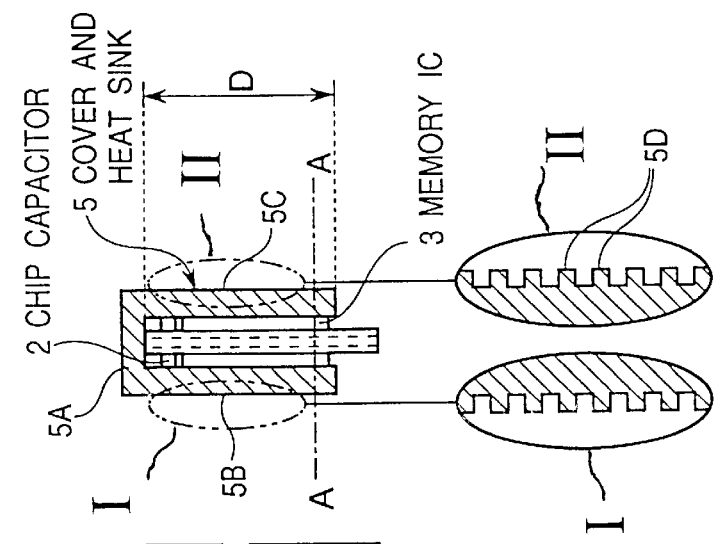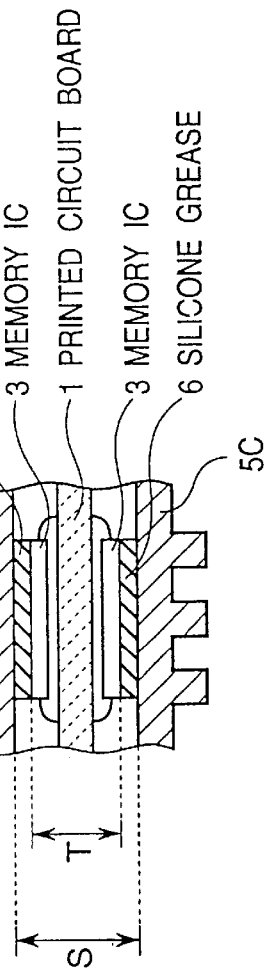

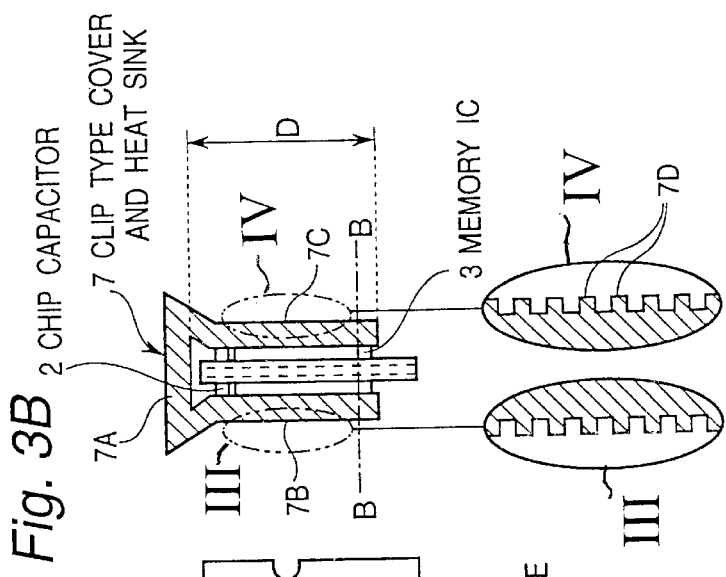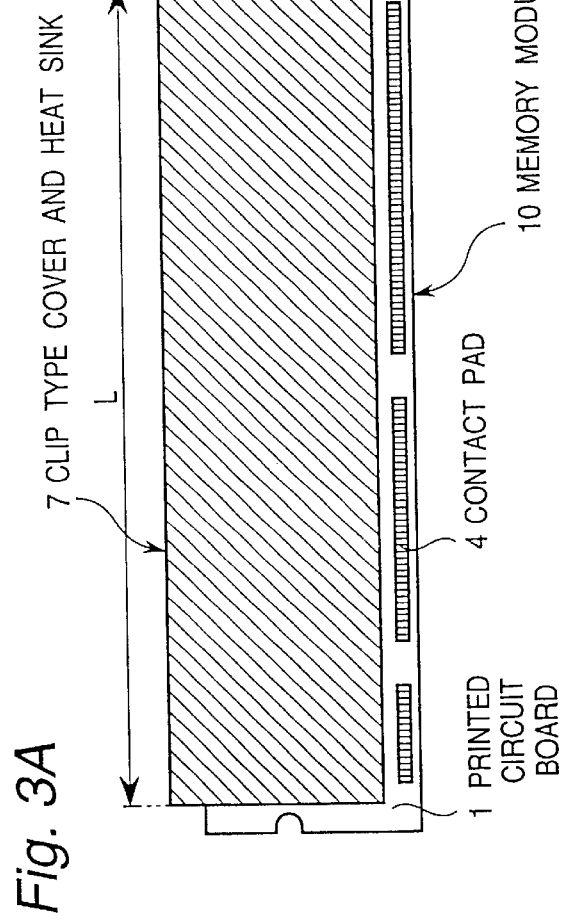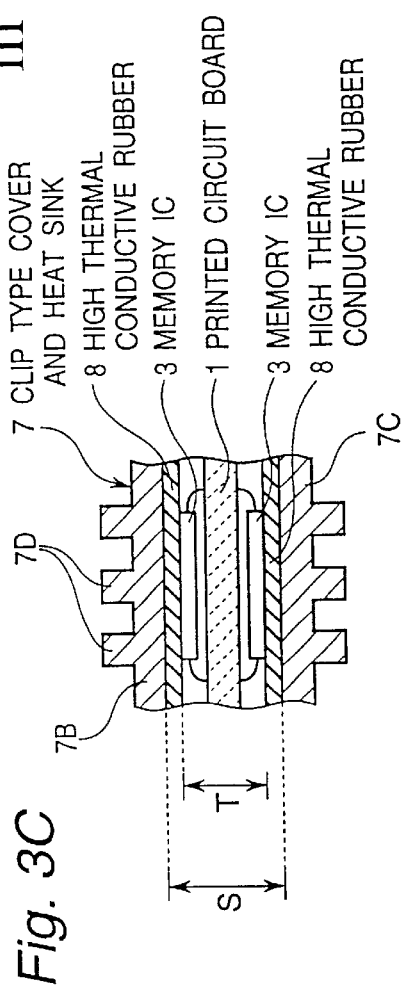

HEAT SINK AND MEMORY MODULE WITH HEAT SINK

BACKGROUND OF THE INVENTION

1. Field of the Invention

The present invention relates to a heat sink configured to be fitted to a memory module, and a memory module fitted with a heat sink, and more specifically to a heat sink configured to be fitted to a memory module composed of a plurality of DRAMs mainly mounted on a printed circuit board, and such a memory module fitted with a heat sink.

2. Description of Related Art

Recently, an increase of the operation speed and the storage capacity in semiconductor memories such as a DRAM (dynamic random access memory) is being rapidly advanced. With an increased integration density of the semiconductor memories, a generated heat amount of the semiconductor memory ICs (integrated circuit) increases correspondingly. In addition, the down-sizing of a module accommodating microelectronic components including the semiconductor memory ICs is demanded. On the other hand, it is in some cases that a memory module includes an IC or the like for compensating for a time delay of a signal caused by an increased operation speed of individual DRAMs. As a result, many ICs and chip-type circuit components are mounted on a printed circuit board in addition to the semiconductor memory ICs, so that the number of components mounted in a memory module has a tendency to increase.

Now, a prior art memory module will be described with reference to FIGS. 1A and 1B, which are a diagrammatic plan view and a diagrammatic side view of one typical example of the prior art memory module. As shown in FIGS. 1A and 1B, the memory module is generally designated with reference number 10, and includes a number of packaged memory ICs 3 and a plurality of chip-type capacitors 2 mounted on each face of a printed circuit board 1. The printed circuit board 1 has an array of contact pads 4 provided along a long-side edge of each face of the printed circuit board 1 for electrical connection with an appropriate mating socket.

As seen from FIGS. 1A and 1B, the semiconductor memory ICs 3 and the chip-type capacitors 2 are mounted on each face of the printed circuit board 1 in a naked condition, and the memory module 10 is inserted into a slot within a system such a personal computer in this naked condition. Therefore, heat generated in the memory ICs 3 is radiated from only the surface of the memory ICs 3.

In the prior art memory module as mentioned above, since the heat radiation from the surface of the memory ICs is only the dissipation of the heat generated in the memory ICs, a satisfactory heat dissipation efficiency cannot be obtained. Further, since the heat radiating efficiency itself is influenced by a shape of the DRAM package, a new problem is encountered in that the performance of the memory drops because of an increased heat of the DRAM caused with an increased integration density.

In addition, since the prior art memory module is assembled in the condition that all components mounted on the module are in a naked condition, there is high possibility that the chip-type components such as capacitors and resistors located at a peripheral zone of the printed circuit board of the memory module are broken or lost because of a mechanical shock in the course of transportation. Furthermore, with an increased performance of the ICs mounted on the printed circuit board of the memory module, a pin pitch of the packaged ICs becomes narrow, with the result that there occurs another new problem such as a short-circuiting between the pins of the IC caused by an external cause.

Besides, the components including the memory ICs are ordinarily mounted on the printed circuit board by locating the components on a solder paste printed on the printed circuit board, and putting the printed circuit board into a reflow oven so that the components are soldered on the printed circuit board. In this process, the printed circuit board is often warped, and if the components are mounted on the warped printed circuit board, when the memory module is inserted into a slot within a system such as a personal computer, a stress acts on the printed circuit board, with the result that the components are peeled off from the printed circuit board.

Japanese Patent Application Pre-examination Publication No. JP-A-07-202120 (an English abstract of JP-A-07-202120 is available and the content of the English abstract is incorporated by reference in its entirety into this application) proposes a high heat radiating memory constructed to efficiently radiate heat generated from a memory IC, by bonding the packaged memory IC to one surface of a heat radiating substrate and by covering the packaged memory IC and the one surface of the heat radiating substrate with resin.

This prior art is intended to elevate the heat radiating efficiency of individual memory ICs, with the result that the memory module composed of a number of memory ICs having a high heat radiating efficiency mounted on a printed circuit board, can have a high heat radiating efficiency in total. However, the individual memory IC becomes complicated in structure and expensive, and therefore, the memory module correspondingly becomes expensive. In addition, this approach cannot solve the problem of the warping of the printed circuit board.

SUMMARY OF THE INVENTION

Accordingly, it is an object of the present invention to provide a heat sink configured to be fitted to a memory module, and a memory module fitted with a heat sink, which have overcome the above mentioned problems of the prior art.

Another object of the present invention is to provide a heat sink which is configured to be fitted to a memory module, and which can efficiently dissipate heat generated from packaged semiconductor memories such as DRAMs mounted on the memory module, and can protect components mounted on a printed circuit board of the memory module, from a mechanical shock, and also can discriminate the degree of warping of the printed circuit board having the packaged semiconductor memories and the other components mounted thereon.

Still another object of the present invention is to provide a memory module fitted with the above mentioned heat sink.

The above and other objects of the present invention are achieved in accordance with the present invention by a heat sink configured to be fitted over a memory module composed of a plurality of packaged memory integrated circuits mounted on a printed circuit board, the heat sink having a U-shape in cross section so that the memory module can be inserted into a U-shaped recess of the heat sink with a thermal conductive material being interposed between the heat sink and the packaged memory integrated circuits mounted on the printed circuit board and being in contact with the heat sink and the packaged memory integrated circuits.

In one embodiment, the thermal conductive material is a high thermal conductive member, and the heat sink is formed of a resilient material to have a clip function so that the memory module is mechanically held by the heat sink through the high thermal conductive member. Preferably, the heat sink has a number of convexities on an outer surface thereof to having an increased outer surface area.

According to another aspect of the present invention, there is provided a memory module composed of a plurality of packaged memory integrated circuits mounted on a printed circuit board, and fitted with a heat sink having a U-shape in cross section in such a manner that the memory module is inserted into a U-shaped recess of the heat sink with a thermal conductive material being interposed between the heat sink and the packaged memory integrated circuits and being in contact with the heat sink and the packaged memory integrated circuits In one embodiment, the thermal conductive material is a high thermal conductive member, and the heat sink is formed of a resilient material to have a clip function so that the memory module is mechanically held by the heat sink through the high thermal conductive member. Preferably, the thermal conductive member is a high thermal conductive rubber having an electrical insulative property, and the heat sink has a number of convexities on an outer surface thereof to having an increased outer surface area.

The heat sink can be detachable from the memory module. In another embodiment, the thermal conductive material is a silicone grease.

More preferably, the heat sink has a length of the heat sink and a depth of the U-shaped recess sufficient to cover all of the packaged memory integrated circuits mounted on a printed circuit board.

The above and other objects, features and advantages of the present invention will be apparent from the following description of preferred embodiments of the invention with reference to the accompanying drawings.

BRIEF DESCRIPTION OF THE DRAWINGS

FIGS. 2A and 2B are a diagrammatic plan view and a diagrammatic cross-sectional view of a first embodiment of the memory module fitted with the heat sink in accordance with the present invention, respectively;

FIG. 2C is a diagrammatic partial sectional view taken along the line A—A in FIG. 2B;

FIGS. 3A and 3B are a diagrammatic plan view and a diagrammatic cross-sectional view of a second embodiment of the memory module fitted with the heat sink in accordance with the present invention, respectively; and FIG. 3C is a diagrammatic partial sectional view taken along the line B—B in FIG. 3B.

DESCRIPTION OF THE PREFERRED EMBODIMENTS

Figure 1B:
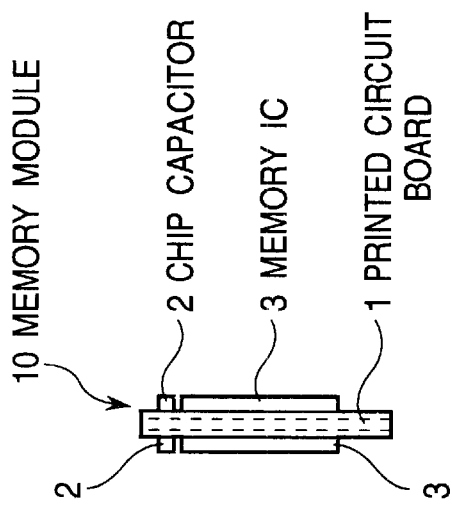
FIGS. 1A and 1B are a diagrammatic plan view and a diagrammatic side view of one typical example of the prior art memory module, respectively.
Figure 1A:
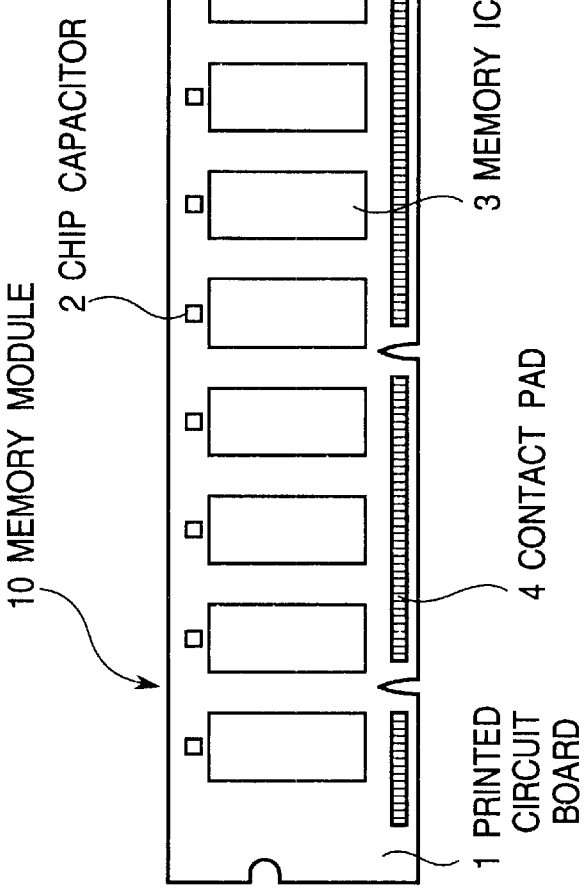

Referring to FIGS. 2A and 2B, there are shown a diagrammatic plan view and a diagrammatic cross-sectional view of a first embodiment of the memory module fitted with the heat sink in accordance with the present invention, respectively. FIG. 2C is a diagrammatic partial sectional view taken along the line A—A in FIG. 2B. In FIGS. 2A, 2B and 2C, elements similar to those shown in FIGS. 1A and 1B are given with the same reference numbers, and explanation will be omitted for simplification.

As seen from comparison between FIGS. 1A and 1B and FIGS. 2A and 2B, the first embodiment is characterized in that the conventional memory module 10 (composed of a plurality of memory ICs 3 and a plurality of chip-type capacitors 2 mounted on a printed circuit board 1 having a number of contact pads 4 located along one side edge of the printed circuit board 1) is fitted with a "cover and heat sink" 5 in accordance with present invention.

This "cover and heat sink" 5 has a U-shape in a cross-section as shown in FIG. 2B. Namely, the "cover and heat sink" 5 has a top plate 5A and a pair of side plates 5B and 5C vertically and straight downward extending from opposite longitudinal sides of the top plate 5A so as to confine therebetween a U-shaped deep recess. A spacing S between opposing inner surfaces of the side plates 5B and 5C is larger than a thickness T of the memory module 10. This spacing S is at constant from an upper end to a lower end of the side plates 5B and 5C. A length L of the "cover and heat sink" 5 and a depth D of the U-shaped deep recess (a distance from an inner surface of the top plate 5A to a free edge of the pair of side plates 5B and 5C) are sufficient to cover all the packaged memory ICs and the other components mounted on the printed circuit board 1, but to maintain the contact pads 4 in an exposed condition. In the shown embodiment, the length L of the "cover and heat sink" 5 is longer than a distance from a left edge of the leftmost packaged memory IC to a right edge of the rightmost packaged memory IC, in FIG. 2A, but shorter than a length of the printed circuit board 1, and the depth D is slightly longer than a distance from an upper end of the printed circuit board 1 to a lower end of the packaged memory ICs in the condition shown in FIG. 2A.

In addition, as shown in FIGS. 2A and 2B, at least the pair of side plates 5B and 5C of the "cover and heat sink" 5 preferably have a number of convexities or small projections 5D formed on an outer surface thereof in order to have an increase surface area so as to elevate heat radiation efficiency. But, not only the pair of side plates 5B and 5C but also both the top plate 5A can have a number of convexities or small projections 5D on an outer surface thereof.

Thus, the "cover and heat sink" 5 is fitted over the memory module 10 in such a manner that the memory module 10 is inserted into the U-shaped deep recess between the pair of side plates 5B and 5C and all the packaged memory ICs 3 and the other components 2 mounted on each face of the printed circuit board 1 are covered by the side plates 5B and 5C but the contact pads 4 are not covered by the side plates 5B and 5C. In this condition, as shown in FIG. 2C, a silicone grease 6 having a good thermal conductivity and an electric insulative property, is filled into a space between the inner surface of each of the side plates 5B and 5C and each of the packaged memory ICs 3 so that the heat generated in each packaged memory IC 3 is conducted through the silicone grease 6 to a corresponding side plate 5B or 5C. Since the silicone grease 6 is between the side plates 5B and 5C of the "cover and heat sink" 5 and each of the packaged memory ICs 3, the "cover and heat sink" 5 is detachable from the memory module 10.

As mentioned above, in the first embodiment, the "cover and heat sink" 5 is fitted over the conventional memory module 10 with the silicone grease 6 being filled between the "cover and heat sink" 5 and the packaged memory ICs 3. With this arrangement, the heat generated in each packaged memory IC 3 is conducted to the "cover and heat sink" 5 through the silicone grease 6, and the heat is radiated from the surface of the "cover and heat sink" 5. Since the outer surface area of the "cover and heat sink" 5 is remarkably larger than the total of respective outer surface areas of all the packaged memory IC 3 mounted on the printed circuit board 1, the heat generated in the packaged memory ICs 3 can be more efficiently dissipated from the "cover and heat sink" 5, than in the conventional memory module 10 shown in FIGS. 1A and 1B. Here, even if the outer surface of the "cover and heat sink" 5 have no convexity 5D, if the outer surface area of the "cover and heat sink" 5 is remarkably larger than the total of respective outer surface areas of all the packaged memory IC 3 mounted on the printed circuit board 1, the convexities 5D may not necessarily be provided on the outer surface of the "cover and heat sink" 5. However, it is the most preferable that the convexities 5D are provided on the outer surface of the "cover and heat sink" 5, since it is possible to further increase the outer surface area of the "cover and heat sink" 5.

Furthermore, since all the packaged memory IC 3 and the other components 2 mounted on the printed circuit board 1 are covered with the "cover and heat sink" 5, the chip-type components such as capacitors and resistors located at a peripheral zone of the printed circuit board 1 are protected from a mechanical shock, and therefore, there is no possibility that the chip-type components located at the peripheral zone of the printed circuit board of the memory module are broken or lost in the course of transportation.

In addition, as mentioned above, when the components including the memory ICs are mounted on the printed circuit board by melting the solder paste printed on the printed circuit board, the printed circuit board is often warped. If the warping of the printed circuit board exceeds a certain limit, the "cover and heat sink" 5 can no longer be fitted over the memory module 10. Therefore, it is possible to discriminate the degree of the warping of the printed circuit board, on the basis of whether or not the "cover and heat sink" 5 can be fitted over the memory module 10. Accordingly, it is possible to prevent the components from being peeled off from the printed circuit board, which would be caused by inserting the printed circuit board having the warping exceeding the limit, into a slot within a system such as a personal computer.

In this first embodiment, it is sufficient if the "cover and heat sink" 5 has a good thermal conductivity and a mechanical strength sufficient to protect the components 2 and 3 mounted on the printed circuit board 1 from a mechanical shock. Accordingly, the "cover and heat sink" 5 can be formed of a metal or a ceramic. In addition, the silicone grease 6 can be replaced with any material which has a viscosity comparable to the silicone grease and which has a thermal stability, an electrical insulative property and a good thermal conductivity. Furthermore, if it is unnecessary to detach the "cover and heat sink" 5 from the memory module 10 after the "cover and heat sink" 5 is fitted over the memory module 10, the silicone grease 6 can be replaced with a close contact adhesive which has a thermal stability, an electrical insulative property and a good thermal conductivity.

Referring to FIGS. 3A and 3B, there are shown a diagrammatic plan view and a diagrammatic cross-sectional view of a second embodiment of the memory module fitted with the heat sink in accordance with the present invention, respectively. FIG. 3C is a diagrammatic partial sectional view taken along the line B—B in FIG. 3B. In FIGS. 3A, 3B and 3C, elements similar to those shown in FIGS. 2A, 2B and 2C are given with the same reference numbers, and explanation will be omitted for simplification.

As seen from comparison between FIGS. 3A, 3B and 3C and FIGS. 2A, 2B and 2C, the second embodiment is different from the first embodiment in that the "cover and heat sink" 5 and the silicone grease 6 of the first embodiment are replaced with a clip type "cover and heat sink" 7 and a high thermal conductive rubber 8 having an electrical insulative property, respectively.

The clip type "cover and heat sink" 7 is formed of a resilient material, for example a metal or ceramic having a spring property, and has a deformed U-shape in cross section, as shown in FIG. 3B. More specifically, the clip type "cover and heat sink" 7 has a top plate 7A and a pair of side plates 7B and 7C downward extending from opposite longitudinal sides of the top plate 7A to first slightly inwardly extend a short distance from the top plate 7A and to then extend vertically and straight, so as to confine therebetween a deformed U-shape deep recess and to have a clip function between the pair of side plates 7B and 7C.

In addition, similarly to the first embodiment, at least the pair of side plates 7B and 7C of the clip type "cover and heat sink" 7 preferably Å@ have a number of convexities or small projections 7D formed on an outer surface thereof in order to have an increase surface area so as to elevate heat radiation efficiency. But, not only the pair of side plates 7B and 7C but also both the top plate 7A can have a number of convexities or small projections 7D on an outer surface thereof.

Similarly to the first embodiment, a spacing S between opposing inner surfaces of a vertical straight portion of the side plates 7B and 7C is larger than a thickness T of the memory module 10. A length L of the "cover and heat sink" 5 and a depth D of the deep recess (a distance from an inner surface of the top plate 7A to a free edge of the pair of side plates 7B and 7C) are sufficient to cover all the packaged memory ICs and the other components mounted on the printed circuit board 1, but to maintain the contact pads 4 in an exposed condition. In addition, the vertical straight portion of each of the side plates 7B and 7C has a size sufficient to cover all the packaged memory ICs and the other components mounted on the printed circuit board 1, as shown in FIG. 3B.

Thus, the clip type "cover and heat sink" 7 is fitted over the memory module 10 in such a manner that the memory module 10 is inserted into the deep recess between the pair of side plates 7B and 7C and that all the packaged memory ICs 3 and the other components 2 mounted on each face of the printed circuit board 1 are covered by the side plates 7B and 7C and held between the side plates 7B and 7C with the high thermal conductive rubber 8 being inserted between the inner surface of each of the side plates 7B and 7C and each of the packaged memory ICs 3. But, the contact pads 4 are not covered by the side plates 7B and 7C.

In this second embodiment, since the "cover and heat sink" 5 is replaced with the clip type "cover and heat sink" 7 formed of the resilient material with the high thermal conductive rubber 8 being inserted between the side plates 7B and 7C and the packaged memory ICs 3, the bonding between the clip type "cover and heat sink" 7 and the packaged memory ICs 3 can be elevated in comparison with the first embodiment. Therefore, the heat generated in each packaged memory IC 3 can be more efficiently conducted to the clip type "cover and heat sink" 7 through the high thermal conductive rubber 8, so that the heat is radiated from the surface of the clip type "cover and heat sink" 7.

Similarly to the first embodiment, since the outer surface area of the clip type "cover and heat sink" 7 is remarkably larger than the total of respective outer surface areas of all the packaged memory IC 3 mounted on the printed circuit board 1, the heat generated in the packaged memory ICs 3 can be more efficiently dissipated from the clip type "cover and heat sink" 7, than in the conventional memory module 10 shown in FIGS. 1A and 1B. In addition, since the bonding between the clip type "cover and heat sink" 7 and the packaged memory ICs 3 can be elevated in comparison with the first embodiment, the heat generated in the packaged memory ICs 3 can be more efficiently dissipated than the "cover and heat sink" 5 of the first embodiment.

Moreover, since the memory module 10 is held by the clip type "cover and heat sink" 7 with an appropriate force exerted by the resilient property of the clip type "cover and heat sink" 7, possibility of the "cover and heat sink" being dropped off from the memory module 10 becomes remarkably small in comparison with the first embodiment using the silicone grease 6.

Furthermore, similarly to the first embodiment, since all the packaged memory IC 3 and the other components 2 mounted on the printed circuit board 1 are covered with the clip type "cover and heat sink" 7, the chip-type components such as capacitors and resistors located at a peripheral zone of the printed circuit board I are protected from a mechanical shock, and therefore, there is no possibility that the chip-type components located at the peripheral zone of the printed circuit board of the memory module are broken or lost in the course of transportation.

In addition, as mentioned above, when the components including the memory ICs are mounted on the printed circuit board by melting the solder paste printed on the printed circuit board, the printed circuit board is often warped. If the warping of the printed circuit board exceeds a certain limit, the clip type "cover and heat sink" 7 can no longer be fitted over the memory module 10. Therefore, similarly to the first embodiment, it is possible to discriminate the degree of the warping of the printed circuit board, on the basis of whether or not the clip type "cover and heat sink" 7 can be fitted over the memory module 10. Accordingly, it is possible to prevent the components from being peeled off from the printed circuit board, which would be caused by inserting the printed circuit board having the warping exceeding the limit, into a slot within a system such as a personal computer.

As seen from the above, the memory module fitted with the heat sink in accordance with the present invention have the following advantages:

A first advantage is that the heat generated in the packaged memory ICs, and preferably the other components, mounted in the memory module can be efficiently dissipated. The reason for this is that, since the heat generating bodies such as the packaged memory ICs are coupled to the "cover and heat sink" through the silicone grease or the high thermal conductive rubber in a good heat conducting relation, the heat generated in the heat generating bodies are efficiently conducted to the "cover and heat sink", and further efficiently dissipated from the surface of the "cover and heat sink" having a large surface area.

A second advantage is that the components mounted on the printed circuit board are protected from a mechanical shock, since all the components mounted on the printed circuit board are covered with the "cover and heat sink" having a mechanical strength sufficient to protect the components mounted on the printed circuit board from the mechanical shock, with the result that an externally applied force is not applied to the components mounted on the printed circuit board.

A third advantage is that it is possible to discriminate whether or not the degree of the warping of the printed circuit board exceeds a permissible limit. Because, if the warping of the printed circuit board (which occurred because of heat and other causes when the components including the memory ICs are mounted on the printed circuit board) exceeds a certain limit, the "cover and heat sink" can no longer be fitted over the memory module. In addition, even if the "cover and heat sink" could be fitted over the memory module having a slight warping, it is possible to know whether or not the component mounted on the printed circuit board is peeled off from the printed circuit board, by carrying out an electric test for the memory module fitted with the "cover and heat sink". Therefore, it is possible to prevent a defective memory module from being supplied to a market.

The invention has thus been shown and described with reference to the specific embodiments. However, it should be noted that the present invention is in no way limited to the details of the illustrated structures but changes and modifications may be made within the scope of the appended claims.

What is claimed is:

1. An apparatus for radiating heat comprising:
   a heat sink configured to be fitted over a module having a specified shape and size, the heat sink having a U-shape cross section disposed to receive the module having the specified shape and size; and
   a thermal conductive material being disposed in the U-shape cross section so as to be interposed between the heat sink and said module having the specified shape and size.

2. The apparatus as claimed in claim 1, wherein said thermal conductive material is a high thermal conductive member, the heat sink is formed of a resilient material, and the module having the specified shape and size is mechanically connected to the heat sink by said high thermal conductive member.

3. The apparatus as claimed in claim 2, wherein the heat sink has a plurality of convexities on an outer surface thereof.

4. The apparatus as claimed in claim 1, wherein the heat sink has a plurality of convexities on an outer surface thereof.

5. A memory module fitted with a heat sink having a U-shape cross section wherein the memory module is inserted into a U-shaped recess of said heat sink with a thermal conductive material being interposed between said heat sink and said memory module.

6. The memory module as claimed in claim 5, wherein said thermal conductive material is a high thermal conductive member, the heat sink is formed of a resilient material, and the memory module is mechanically connected to the heat sink by said high thermal conductive member.

7. The memory module as claimed in claim 6, wherein said thermal conductive material is a high thermal conductive rubber having a high electrical insulative property.

8. The memory module as claimed in claim 6, wherein said heat sink has a plurality of convexities on an outer surface thereof.

9. The memory module as claimed in claim 6, wherein said heat sink is removably attached to the memory module.

10. The memory module as claimed in claim 5, wherein said thermal conductive material comprises a silicone grease.

11. The memory module as claimed in claim 10, wherein the heat sink has a plurality of convexities on an outer surface thereof.

12. The memory module as claimed in claim 10, wherein said heat sink is removably attached to the memory module.

13. The memory module as claimed in claim 5, wherein the heat sink has a plurality of convexities on an outer surface thereof.

14. The memory module as claimed in claim 5, wherein said heat sink is removably attached to the memory module.

15. The memory module as claimed in claim 5, wherein said thermal conductive material is a high thermal conductive rubber having a high electrical insulative property.

16. A memory module claimed in claim 5 wherein said heat sink has a length of said heat sink and a depth of said U-shaped recess sufficient to cover all of said packaged memory integrated circuits mounted on a printed circuit board.

17. The apparatus of claim 3, wherein a top portion of said heat sink includes at least one of said convexities.

18. The apparatus of claim 17, wherein at least one side of said heat sink includes at least one of said convexities.

19. The apparatus of claim 4, wherein a top portion of said heat sink includes at least one of said convexities.

20. The apparatus of claim 4, wherein at least one side of said heat sink includes at least one of said convexities.

21. The memory module of claim 11, wherein at least one side of said heat sink include at least one of said convexities.

22. The memory module of claim 11, wherein a top portion of said heat sink includes at least one of said convexities.

23. The memory module of claim 13, wherein at least one side of said heat sink include at least one of said convexities.

24. The memory module of claim 13, wherein a top portion of said heat sink includes at least one of said convexities.

25. The apparatus of claim 1, wherein said heat sink is made of one of: a metal and a ceramic material.

26. The memory module of claim 5, wherein said heat sink is made of one of: a metal and a ceramic material.

* * * * *